(12) United States Patent
Li et al.

(10) Patent No.: US 6,918,960 B2
(45) Date of Patent: *Jul. 19, 2005

(54) CVD OF PTRH WITH GOOD ADHESION AND MORPHOLOGY

(75) Inventors: Weimin Li, Boise, ID (US); Mark R. Visokay, Richardson, TX (US)

(73) Assignee: Micron Technology, Inc., Boise, ID (US)

( * ) Notice: Subject to any disclaimer, the term of this patent is extended or adjusted under 35 U.S.C. 154(b) by 430 days.

This patent is subject to a terminal disclaimer.

(21) Appl. No.: 09/997,073

(22) Filed: Nov. 28, 2001

(65) Prior Publication Data

US 2003/0100183 A1 May 29, 2003

(51) Int. Cl.[7] ............................................... C30B 25/00
(52) U.S. Cl. ........................... 117/89; 117/84; 117/88; 117/104; 117/937; 117/938; 438/584
(58) Field of Search ............... 117/89, 84, 88, 117/104, 937, 938; 438/584

(56) References Cited

U.S. PATENT DOCUMENTS

| | | | |
|---|---|---|---|
| 5,130,172 A | 7/1992 | Hicks et al. | |
| 5,552,327 A | 9/1996 | Bachmann et al. | |
| 5,576,071 A | 11/1996 | Sandhu | |
| 5,672,385 A | 9/1997 | Jimba et al. | |
| 5,763,007 A | 6/1998 | Weiller | |
| 5,783,716 A | 7/1998 | Baum et al. | |
| 5,874,364 A * | 2/1999 | Nakabayashi et al. | ...... 438/738 |
| 5,902,651 A | 5/1999 | Westmoreland et al. | |
| 5,990,559 A * | 11/1999 | Marsh | ...... 257/768 |
| 6,140,230 A | 10/2000 | Li | |
| 6,180,974 B1 | 1/2001 | Okutoh et al. | |
| 6,201,271 B1 | 3/2001 | Okutoh et al. | |
| 6,203,613 B1 * | 3/2001 | Gates et al. | ...... 117/104 |
| 6,271,131 B1 | 8/2001 | Uhlenbrock et al. | |
| 6,319,832 B1 * | 11/2001 | Uhlenbrock et al. | ...... 438/681 |
| 6,403,414 B2 | 6/2002 | Marsh | |
| 6,475,854 B2 | 11/2002 | Narwankar et al. | |
| 6,524,867 B2 * | 2/2003 | Yang et al. | ...... 438/3 |
| 2001/0000865 A1 | 5/2001 | Gaughen et al. | |
| 2001/0043453 A1 | 11/2001 | Narwankar et al. | |
| 2001/0044207 A1 | 11/2001 | Marsh | |
| 2002/0076492 A1 | 6/2002 | Loan et al. | |
| 2003/0119313 A1 * | 6/2003 | Yang et al. | ...... 438/681 |

OTHER PUBLICATIONS

Irving, Optical Diagnostics for Thin Film Processing, Academic Press, 1996, p. 29.

* cited by examiner

*Primary Examiner*—Nadine G. Norton
*Assistant Examiner*—Matthew J Song
(74) *Attorney, Agent, or Firm*—Knobbe, Martens, Olson & Bear, LLP.

(57) ABSTRACT

A method and system for performing metal-organic chemical vapor deposition (MOCVD). The method introduces a metal-organic compound into the CVD chamber in the presence of a first reactant selected to have a reducing chemistry and then, subsequently, a second reactant selected to have an oxidizing chemistry. The reducing chemistry results in deposition of metal species having a reduced surface mobility creating more uniform coverage and better adhesion. The oxidizing species results in deposition of metal species having a greater surface mobility leading to greater surface agglomeration and faster growth. By alternating the two reacts, faster growth is achieved and uniformity of the metal structure is enhanced.

26 Claims, 3 Drawing Sheets

CVD OF PTRH WITH GOOD ADHESION AND MORPHOLOGY

BACKGROUND OF THE INVENTION

1. Field of the Invention

The present invention relates to semiconductor processing and, in particular, concerns a chemical vapor deposition (CVD) technique for forming conductive layers, such as platinum-rhodium layers, in a manner that results in better adhesion of the component layer on the surface of a semiconductor device and better morphology of the layer.

2. Description of the Related Art

Modern semiconductor chemical vapor deposition (CVD) technology has provided fabrication procedures for the development of VLSI (Very-Large-Scale Integration) and ULSI (Ultra-Large-Scale Integration) circuitry. Even though the number of surface mounted semiconductor devices has significantly increased, the surface density is often limited by the finite quantity of real estate on the semiconductor wafer surface. As a result, the finite surface density limitation has induced growth in the vertical direction of modern semiconductor devices. This often requires multiple levels of the conductive interconnects that often, in turn, require numerous metallic-based deposition layers.

As the size of the conductive elements has decreased to accommodate higher density of components, many conventional semiconductor processing techniques for forming conductive elements are forming conductive elements that exhibit more gaps and pinholes and poorer adhesion to the substrate. One particular CVD deposition technique utilized for forming conductive elements is Metal-organic Chemical Vapor Deposition (MOCVD). However, conventional MOCVD techniques alone cannot always compensate for the relatively poor adhesion and morphology that occurs in smaller devices.

For example, complex chemical reactions that occur during the formation of semiconductor devices dictate the final composition of the deposited layer, which may be different than the intended composition. Specifically, the grain structure within the deposited layer may vary depending on the growth rate and the growth environment during the manufacturing and deposition process. A variance in the grain size and grain structure within deposited layers of similar composition and thickness may interfere with or alter the conduction characteristics of electrical current flow through the grain interfaces.

A typical MOCVD technique is as follows. A precursor gas, comprising at least one conductive component or element, and other reactants are introduced into a CVD chamber, and the conductive element carried by the precursor gas is then deposited onto the semiconductor surface of the semiconductor substrate through thermal decomposition. The precursor gas may often be a metal-organic compound, wherein conductive atoms may be bonded to organic compounds, which allows the conductive atoms to be transferred to the semiconductor surface in a gas phase. This enables the conductive atoms, such as platinum and rhodium, to be deposited over the surface of the semiconductor substrate surface as the metal-organic compound facilitates conventional step coverage.

In the prior art, there is generally only a single deposition step such that the precursor gas is introduced into the CVD chamber until enough conductive molecules have been deposited on the exposed semiconductor surface to form a conductive element of a desired thickness. However, as discussed above, conventional MOCVD techniques can result in poor adhesion and poor morphology of the deposited conductive element. This problem is exacerbated in higher density applications requiring smaller conductive components.

From the foregoing, it will be appreciated that there is a need for an improved conductive layer processing technique for depositing, in one embodiment, conductive materials onto a semiconductor substrate surface such that improved substrate adhesion and improved morphology may be obtained without a significant increase in the cost of manufacturing the conductive film layer. To this end, there is also a need for a more efficient method of depositing conductive elements, such as platinum and rhodium, in a manner that exhibits an improved grain interface structure and greater compositional uniformity.

SUMMARY OF THE INVENTION

The aforementioned needs are satisfied by the present invention which, in one aspect is comprised of a method of forming a conductive layer on a substrate. In this aspect, the method comprises positioning the substrate in a chemical vapor deposition (CVD) chamber and then introducing at least one precursor gas, having at least one conductive component and at least one organic component, into the CVD chamber. A first reactant gas is then introduced into the chamber so as to disassociate the at least one conductive component from the at least one organic component at one activation energy so as to result in a first layer of conductive material being formed on the substrate. A second reactant gas is then introduced into the chamber after introducing the first reactant gas so as to disassociate the at least one conductive component from the at least one organic component at another activation energy greater than the first energy so as to result in columnar growths of conductive material from the first layer of the conductive material formed on the substrate. The method further comprises reintroducing the first reactant gas into the chamber so as to planarize the conductive film by filling in gaps between the columnar growths of the conductive material.

In one embodiment, the first reactant gas is a reducing gas and the second reactant gas is an oxidizing gas. The use of the reducing gas results in reduced surface mobility of the atoms which results in greater step coverage and promotes better adhesion. The periodic use of the oxidizing gas results in greater surface mobility causing the atoms to agglomerate together which promotes faster columnar growths. The periodic reintroduction of the first reactant gas, however, results in better filling in of the gaps and pin holes resulting from the faster columnar growths. In one specific embodiment, the at least one precursor gas is a mixture of gases, which comprises platinum, rhodium, or a combination thereof. In another specific embodiment, a plurality of precursor gases may be used, wherein a first precursor gas comprises a platinum component and a second precursor gas comprises a rhodium component.

In another aspect of the invention, the invention comprises a method of forming a conductive structure on a semiconductor substrate. The method comprises (i) performing a first metal-organic chemical vapor deposition step using a first chemistry selected to provide more uniform coverage of the semiconductor substrate and (ii) performing a second metal-organic chemical vapor deposition step using a second chemistry selected to provide for increased columnar growth. The method further comprises alternating the acts (i) and (ii) until a conductive structure of a pre-selected thickness is formed on the semiconductor substrate so that the performance of the first metal-organic chemical vapor deposition act decreased gaps and pin holes formed during the performance of the second metal-organic chemical vapor deposition act.

In yet another aspect of the invention, the invention comprises a system for forming a conductive element on a semiconductor device. The system comprises a CVD chamber that receives the semiconductor device. The system also includes a precursor gas supply system that provides at least one precursor gas to the CVD chamber, wherein the at least one precursor gas comprises conductive components that when deposited on the semiconductor device form the conductive element and organic components which facilitate step coverage of the conductive element over the semiconductor device. The system also includes a reactant gas supply system that provides both a first reactant and a second reactant into the chamber so that the precursor gas is deposited using both a first chemistry and a second chemistry such that the first chemistry provides more uniform step coverage and the second chemistry provides increased vertical growth of the conductive element, which is comprised by the at least one precursor gas, on the semiconductor substrate.

The aspects of the present invention result in a process or system for forming conductive elements that is both efficient and leads to improved morphology and adhesion. These and other objects and advantages will become more apparent from the following description taken in conjunction with the accompanying drawings.

DETAILED DESCRIPTION OF THE PREFERRED EMBODIMENT

Figure 1:
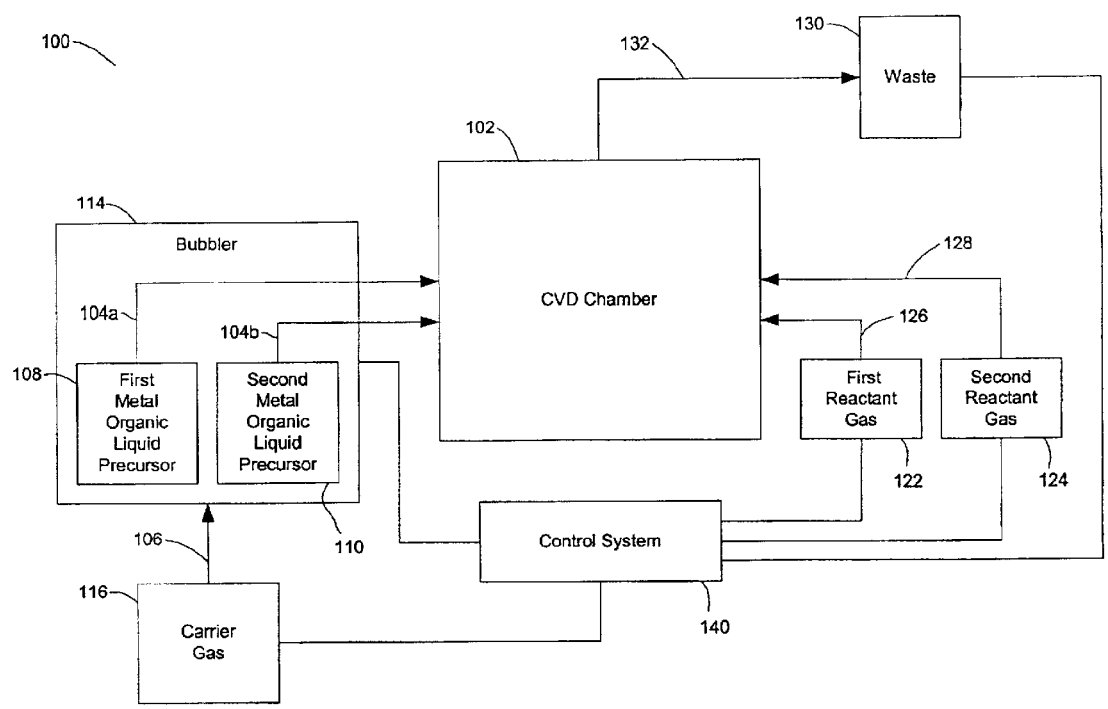
FIG. 1 is a schematic illustration of a system block diagram, which depicts one embodiment of a deposition system for the formation of a conductive structure on a semiconductor device.

Reference will now be made to the drawings wherein like numerals refer to like parts throughout. FIG. 1 is a block diagram of one embodiment of a deposition system 100 for the formation of a conductive structure or element of the present invention. As is illustrated in FIG. 1, a chemical vapor deposition (CVD) chamber 102, of a type known in the art, is supplied with precursor gases 104a, 104b that is utilized to deposit conductive layers and structures on semiconductor devices positioned within the CVD chamber 102. In particular, a carrier gas 106 from a carrier gas source 116 is supplied to a bubbler 114, which, in this embodiment, comprises a first metal-organic liquid precursor 108 and a second metal-organic liquid precursor 110.

Additionally, the carrier gas 106 is utilized to carry the vapor of the conductive metal-organic components comprised by the liquid precursors 108 and 110. Furthermore, a first metal-organic precursor gas 104a develops from the first metal-organic liquid precursor 108, and a second metal-organic precursor gas 104b develops from the second metal-organic liquid precursor 110. In one embodiment, the precursor gases 104a, 104b may be introduced separately, in either a simultaneous manner or at pre-determined temporal intervals, to the CVD chamber 102 in a manner known in the art. In another embodiment, the precursor gases 104a, 104b may be mixed within the bubbler chamber 122 so as to form a precursor gas mixture that may then be introduced to the CVD chamber 102 in a manner known in the art.

In one preferred embodiment, the carrier gas 106 is a known helium-based inert gas, which serves to carry the vapor of the liquid precursors 108 and 110. The inert helium-based carrier gas 106 is supplied to the bubbler 114, which houses the first metal-organic liquid precursor 108, such as, for example, methylcyclopentadienyl trimethyl platinum (MeCpPtMe$_3$) (See, FIG. 3A), and the second metal-organic liquid precursor 110, such as, for example, Dicarbonyl Cyclopenda Dienyl Rhodium (DCDR)(See, FIG. 3B). The carrier gas 106 carries the vapor of the liquid precursors 108 and 110, which may comprise the platinum-based metal-organic components and the rhodium-based metal-organic components. In one aspect, the platinum-based metal-organic vapor and the rhodium-based metal-organic vapor may then be mixed in the bubbler chamber 114 and subsequently introduced to the CVD chamber 102 for a pre-selected period of time so as to allow the conductive metal-organic components to coat the semiconductor device via chemical vapor deposition techniques. In another aspect, the first precursor gas 104a, such as the platinum-based metal-organic vapor, and the second precursor gas 104b, such as the rhodium-based metal-organic vapor, may be separately introduced to the CVD chamber 102 for a pre-selected period of time so as to allow the conductive metal-organic components to coat the semiconductor device via chemical vapor deposition techniques.

While in this particular embodiment, the metal-organic precursor gases 104a, 104b have platinum-based and/or rhodium-based components, it will be appreciated that any of a number of different precursor gases and/or vapors may be used without departing from the scope of the present invention. These metal-organic gases and/or vapors include, but are not limited to, gases and/or vapors that entrain conductive elements such as Pt, Rh, Ir, Ni, Co, Cu, W, and the like or any combination thereof.

As is also illustrated in FIG. 1, the deposition system 100 includes a first reactant source 122 that provides a first reactant vapor 126 and a second reactant source 124 that provides a second reactant vapor 128 into the CVD chamber 102 that are alternatively selected so as to interact with the conductive metal-organic compounds of the precursor gases 104a, 104b to thereby facilitate more a more uniform and efficient deposition of the conductive metal-organic molecules comprised by the precursor gases 104a, 104b. Providing the reactant vapors, 126 and 128, into the CVD chamber 102 allows the metal-organic molecules comprised by the precursor gases 104a, 104b to deposit on the surface of the semiconductor device that is positioned within the CVD chamber 102. As is also illustrated in FIG. 1, the illustrated chemical vapor deposition system 100 also includes a waste gas receptacle 130 that receives waste gas 132, which may comprise unused precursor gases 104a, 104b, unused reactant vapors, 126, 128, and other reaction by-products produced during the CVD process. In the preferred CVD process, the first reactant vapor 126 is a reducing agent, such as diatomic hydrogen or a hydrogen derivative (H$_2$), and the second reactant vapor is an oxidizing agent, such as diatomic oxygen or an oxygen derivative (NO, $N_2O$, $O_2$, or $O_3$).

Figure 2A:
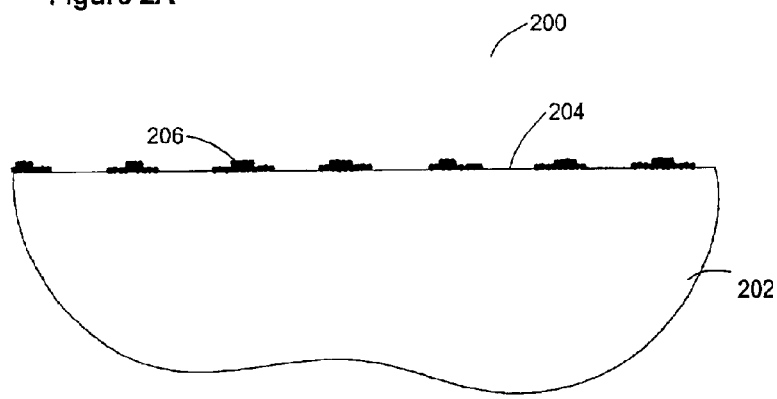
FIGS. 2A–2E are cross-sectional views of a semiconductor device illustrating one embodiment of a method, whereby a conductive structure is formed on the semiconductor device.

FIGS. 2A–2E are cross-sectional views of a semiconductor device 200 depicting one embodiment of a deposition process and method of the illustrated embodiment in greater detail, whereby a conductive structure is formed on the semiconductor device 200. As is illustrated in FIG. 2A, a semiconductor device 200, which may comprise a semiconductor substrate 202 with a surface 204, is positioned within the CVD chamber 102. The precursor gases 104a, 104b are introduced into the CVD chamber 102 such that a conductive material, such as platinum-rhodium (PtRh), is deposited on the exposed surface 204 of the semiconductor device 200. The deposition process begins with a nucleation process, wherein nucleation sites develop as the first few metal-organic molecules are deposited onto the semiconductor substrate surface 204. The nucleation process involves the first reactant vapor 126, which is simultaneously introduced into the CVD chamber 102 along with the precursor gases 104a, 104b. The first reactant vapor 126 is preferably selected to serve as a reducing agent that reacts with the precursor gases 104a, 104b. Additionally, the resulting reduction chemistry may offer a more uniform nucleation on the semiconductor substrate surface 204, which may possibly be due to its comparatively low reaction energy and comparatively resulting low surface mobility. In one particular embodiment, the first reactant vapor 126 includes a hydrogen based gas, such as a gas selected from the group of $H_2$, $NH_3$ or $H_2O$.

The comparatively low reaction energy may provide for a comparatively low surface mobility as the metal-organic molecules adhere more readily to the semiconductor surface 204 with less surface movement and less tendency to agglomerate together. The low reaction energy, the low surface mobility, and the low deposition rate of the reduction chemistry may provide increased uniformity and less agglomeration, which may lead to better adhesion of the conductive film layer during the nucleation process stage. Good adhesion during the initial stage of the conductive film formation process produces a semiconductor device film layer with less internal defects, which serves to improve the functionality, integrity, and reliability of the device. Also, residual hydrogen bonding of conductive elements to the semiconductor substrate surface may also contribute to the good nucleation adhesion.

Figure 2B:
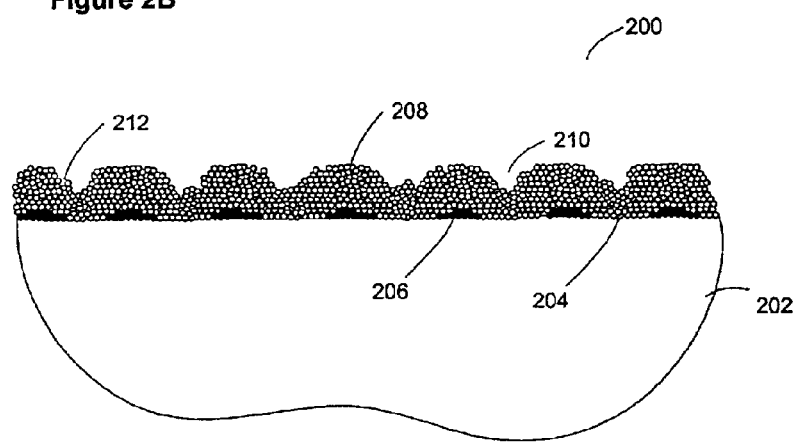

FIG. 2B graphically illustrates the results of further growth of the initial nucleation sites. After the nucleation process is complete, the first reactant vapor 126 is no longer introduced into the CVD chamber 102. Instead, the second reactant vapor 128 is simultaneously introduced into the CVD chamber 102 along with the precursor gases 104a, 104b. The second reactant vapor 128, in one embodiment, serves as an oxidizing agent that reacts with the precursor gases 104a, 104b, and, due to its high reaction energy, the applied oxidation chemistry results in rapid columnar growths 208 above the initial nucleation sites that were deposited with reduction chemistry on the semiconductor substrate surface 204. The high reaction energy state may provide for an increased surface mobility as the metal-organic molecules begin to adhere to the semiconductor surface 204 which results in the metal atoms agglomerating together into the columns. The fast columnar growth tends to leave gaps 210 and pinholes 212 between the grain structures of the conductive elements. These flaws may be corrected with the application of another reduction chemistry process, which will be further described herein below. In one embodiment, the second reactant vapor 128 is comprised of an oxygen containing gas such as $N_2O$, $O_2$, NO or $O_3$.

Figure 2C:
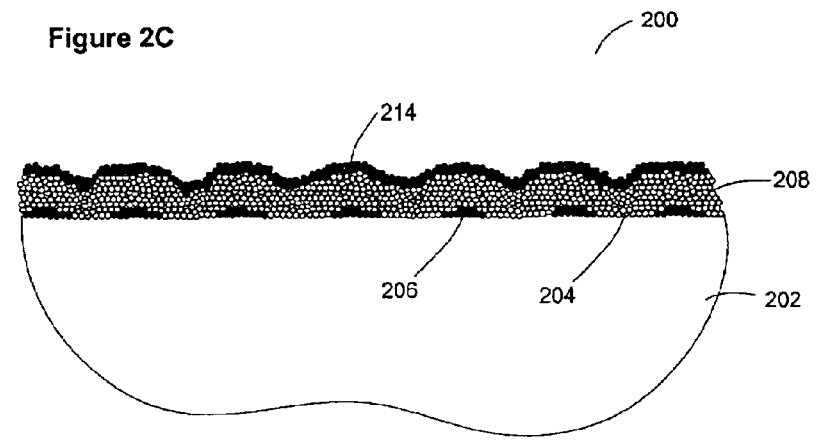

FIG. 2C graphically illustrates the subsequent processing-step of repeating the application of reduction chemistry to the semiconductor device 200. After the oxidation layer 208 is complete, the second reactant vapor 128 is no longer introduced into the CVD chamber 102, but, instead, the first reactant vapor 126 is introduced into the CVD chamber 102 along with the introduction of the precursor gases 104a, 104b. Due to the lower reaction energy and the resulting lower surface mobility of depositing conductive elements with reduction chemistry, inserting a conductive layer deposited with reduction chemistry interposed between two conductive layers deposited with oxidation chemistry may serve to disrupt the grain structure in the direction normal to the semiconductor surface 204. In addition, the slow depositions rates of reduction chemistry may tend to fill in the gaps and pinholes left by the rapid growth rates of oxidation chemistry.

Figure 2D:
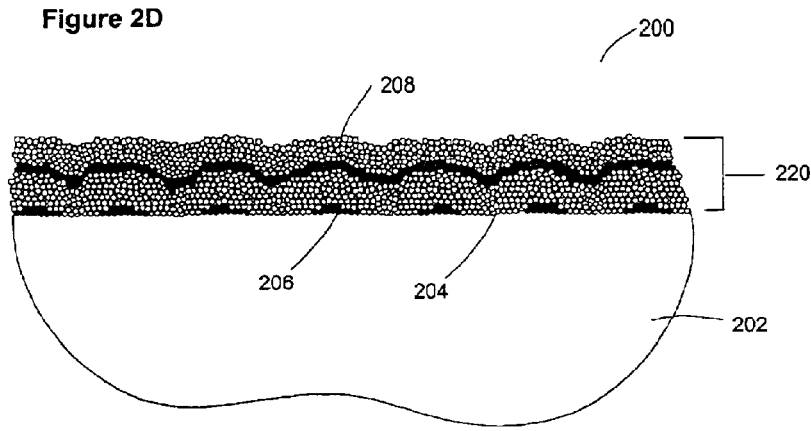
Figure 2E:
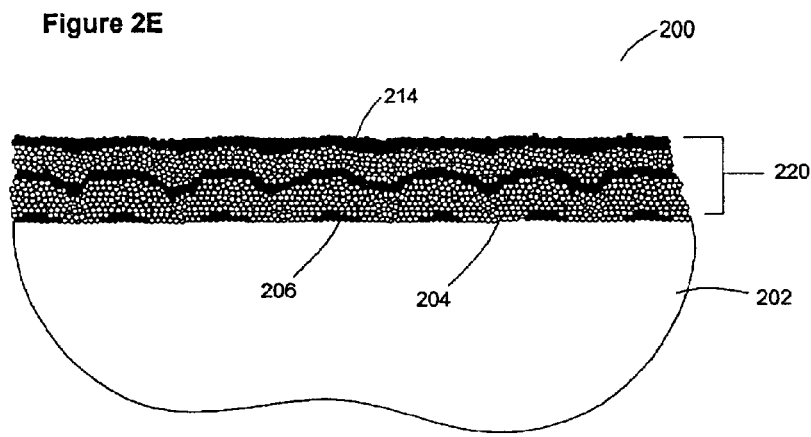

FIG. 2D graphically illustrates that the next layer of oxidation chemistry will grow more uniformly. As is illustrated in FIG. 2D, the use of the oxidation chemistry by the introduction of the second reactant vapor 128, results in quicker growth of the thin film layer, as discussed above. However, as is illustrated in FIG. 2E, alternating reduction and oxidation chemistry processes results in an improved grain structure as a result of the reducing chemistry filling in more of the gaps and pin holes. The process of alternating reduction and oxidation chemistries may be repeated until the desired thickness of the conductive layer is achieved.

The advantage of utilizing reduction chemistry for the initial nucleation phase is the reduced surface mobility of the metallic molecules, such as platinum, rhodium, and/or a combination thereof. A reduced surface mobility of the metallic molecules results in a more uniform coverage of the semiconductor surface 204, improved adhesion and improved morphology of the metallic molecules onto the semiconductor surface 204. The uniform coverage is the result of less agglomeration of the metallic molecule during the reduction chemistry phase of the MOCVD process, which results in a reduction of gaps and pinholes in the conductive film layer. Additionally, there may also be some residual hydrogen bonding between the substrate molecules and the metallic molecules, which may also contribute to the improved adhesion of the metallic molecules onto the semiconductor substrate surface.

Furthermore, the advantage of utilizing oxidation chemistry after the reduction chemistry is that oxidation reactions involve higher reaction energies, which result in an increased surface mobility of the metallic molecules, such as platinum and rhodium. The higher reaction energy of the metallic molecules increases the agglomeration rate, which results in a rapid columnar growth rate. Although the rapid growth rate may cause poorer adhesion and morphology, such that gaps and pinholes in the film layer more readily occur, the addition of another reduction film layer interposed between two oxidation layers tends to reduce the problems of poorer adhesion morphology.

Another advantage to alternating the reduction and oxidation chemistries is that reduction contaminates, such as carbon, left behind by the metal-organic reduction reactions may be burned out of the conductive film layer during the oxidation process, which improves the overall purity and cohesion of the metallic molecules to each other and to the semiconductor surface. Additionally, the process of alternating the reduction and oxidation chemistries produces metal-organic deposition layers that exhibit the ability to maintain a uniform topography, wherein the deposited layers have a substantially flat and smooth surface. The improved morphology results in the reduction of surface defects, such as step layer thinning, cracks, and surface reflections.

Figure 3A:
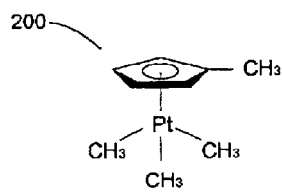
FIG. 3A is a graphical illustration of a typical platinum precursor gas molecule used in a CVD process.
Figure 3B:
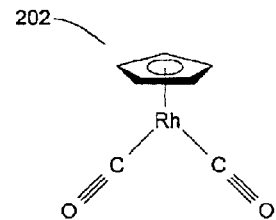
FIG. 3B is a graphical illustration of a typical rhodium precursor gas molecule used in a CVD process.

In one particular example of the above process, a conductive layer 220 is formed using an initial deposition step, wherein a platinum-rhodium precursor carrier gas is provided from the conductive carrier gas source 116 through the bubbler 114 at a rate of between 5 to 300 sccm with the platinum-rhodium being encapsulated within a helium carrier. The bubbler 114 contains a liquid precursor at a temperature between 20° C. and 200° C., such that the resulting precursor gases 104a, 104b emanating from the bubbler 114 has the chemical composition as illustrated in FIGS. 3A and 3B. The resulting precursor gases 104a, 104b is provided from the bubbler 114 to the CVD chamber 102 along with an initial simultaneous introduction of $H_2$ reactant 126 at a rate of 50 to 1000 sccm from the reactant source 122. This introduction of precursor gases 104a, 104b and reactant 126 is provided to the CVD chamber 102 for approximately 50 seconds to result in deposition of the nucleation sites 206. At the end of the approximately 50 second nucleation period, the introduction of the precursor gases 104a, 104b from the bubbler 114 is continued while the introduction of the $N_2O$ reactant 128 from the reactant source 124 is continued for approximately 50 seconds. The $N_2O$ thus comprises the reactant 128, which reacts with the metal-organic compounds comprised by the precursor gases 104a, 104b in the deposited layer 160 to further grow the conductive layer 220. These two process steps are alternately repeated until a conductive layer or element of a desired thickness is formed.

From the foregoing, it will be appreciated that the above-described metal-organic chemical vapor deposition process illustrates a method of forming a conductive film layer 220 or structure on a semiconductor device 202 that results in a more uniform conductive film structure with improved adhesion and morphology. This results in a significantly efficient conductive device that exhibits improved conduction and less resistivity between grain interfaces. Moreover, the improved efficiencies may also result in faster devices that exhibit improved reliability and functionality overall.

Although the foregoing description of the preferred embodiment of the present invention has shown, described and pointed out the fundamental novel features of the invention, it will be understood that various omissions, substitutions and changes in the form of the detail of the apparatus as illustrated as well as the uses thereof, may be made by those skilled in the art without departing from the spirit of the present invention. Consequently, the scope of the present invention should not be limited to the foregoing discussions, but should be defined by the appended claims.

What is claimed is:

1. A method of forming a metal-organic film on a substrate, the method comprising;
   introducing at least one metal-organic compound into a CVD chamber via a carrier gas;
   (i) introducing a first reactant gas into the CVD chamber for a first period of time wherein the first reactant gas reacts with the metal-organic compound so as to disassociate the metal component from the organic component at a first reaction energy to thereby result in the metal being deposited on the substrate at a first surface mobility to thereby form nucleation sites for the metal-organic film on the substrate;
   (ii) introducing a second reactant gas into the CVD chamber for a second period of time wherein the second reactant gas reacts with the metal-organic compound so as to disassociate the metal component from the organic component at a second reaction energy, greater than the first reaction energy to thereby result in the metal components being deposited at a second surface mobility to thereby result in increased agglomeration of the metal component to increase the growth rate of the metal film on the substrate;
   (iii) re-introducing the first reactant gas into the CVD chamber for a third period of time, wherein the first reactant gas results in deposition of the metal component into interstitial spaces formed during the increased agglomeration of the metal component on the substrate during introduction of the second reactant gas to thereby improve surface morphology of the metal film;

2. The method of claim 1, wherein the metal-organic compound comprises at least one conductive component and at least one organic component.

3. The method of claim 1, wherein positioning the semiconductor device within the chemical vapor deposition chamber comprises positioning a semiconductor wafer having an isolation region with a semiconductor substrate surface therein in the chemical vapor deposition chamber so that the semiconductor surface may be coated with the conductive layer so as to form an electrode.

4. The method of claim 1, wherein the metal-organic compound is a precursor gas mixture selected from the group consisting of a platinum-based precursor gas and a rhodium-based precursor gas.

5. The method of claim 2, wherein the at least one conductive component is bonded to at least one organic group when forming the conductive layer.

6. The method of claim 1, wherein the metal-organic compound is a precursor gas selected from the group consisting of a Methylcyclopentadienyl Trimethyl Platinum vapor and a Dicarbonyl Cyclopentadienyl Rhodium vapor into the chemical vapor deposition chamber.

7. The method of claim 1, wherein introducing the first reactant into the chemical vapor deposition chamber comprises introducing the first reactant simultaneously with the conductive precursor gas.

8. The method of claim 1, wherein introducing the second reactant into the chemical vapor deposition chamber comprises introducing the second reactant simultaneously with the conductive precursor gas.

9. The method of claim 1, wherein the first reactant is a reducing agent and is selected from the group consisting of $H_2$, $NH_3$, and $H_2O$.

10. The method of claim 1, wherein the second reactant is an oxidizing agent and is selected from the group consisting of $N_2O$, $_2$, NO, and $O_3$.

11. A method of forming a conductive layer on a substrate, the method comprising:
    positioning the substrate in a chemical vapor deposition (CVD) chamber;
    introducing at least one precursor gas, having a conductive component and an organic component, into the CVD chamber,
    introducing a first reactant gas into the chamber so as to disassociate the metal component from the organic component at a first energy so as to result in a first layer of conductive material being formed on the substrate;
    introducing a second reactant gas into the chamber after introducing the first reactant gas so as to disassociate the metal component from the organic component at a second energy, different than the first energy, so as to result in columnar growths of conductive material from the first layer of conductive material formed on the substrate; and re-introducing the first reactant gas into the chamber so as to planarize the conductive film by filling in gaps between the columnar growths of the conductive material.

12. The method of claim 11, wherein introducing the precursor gas into the CVD comprises introducing a precursor gas selected from the group consisting of a platinum precursor gas and a rhodium precursor gas.

13. The method of claim 11, wherein introducing the conductive precursor gas into the CVD chamber comprises introducing a conductive precursor gas selected from the group consisting of a Methylcyclopentadienyl Trimethyl Platinum vapor and a Dicarbonyl Cyclopentadienyl Rhodium vapor into the chemical vapor deposition chamber.

14. The method of claim 11, wherein introducing the first reactant into the CVD chamber comprises introducing a reducing reactant into the chamber.

15. The method of claim 14, wherein introducing the first reactant into the CVD chamber comprises introducing a reactant into the chamber selected from the group consisting of $H_2$, $NH_3$, and $H_2O$.

16. The method of claim 11, wherein introducing the second reactant into the CVD chamber comprises introducing an oxidizing reactant into the chamber.

17. The method of claim 16, wherein introducing the second reactant into the CVD chamber comprises introducing an oxidizing agent selected from the group consisting of $N_2O$, $O_2$, NO and $O_3$.

18. A method of forming a conductive structure on a semiconductor substrate, the method comprising:

(i) performing a first metal-organic chemical vapor deposition step using a first chemistry selected to provide more uniform coverage of the semiconductor substrate;

(ii) performing a second metal-organic chemical vapor deposition step using a second chemistry selected to provide for increased columnar growth; and alternating the acts (i) and (ii) until a conductive structure of a pre-selected thickness is formed on the semiconductor substrate so that the performance of the first metal-organic chemical vapor deposition step decreases gaps and pin holes formed during the performance of the second metal-organic chemical vapor deposition step.

19. The method of claim 18, wherein the act of performing the first metal-organic chemical vapor deposition step is initially performed so that the first metal-organic chemical vapor deposition step results in the formation of an initial layer on the semiconductor substrate.

20. The method of claim 18, wherein the first metal-organic chemical vapor deposition step is performed using a chemistry selected so that the resulting deposited metal species has a first surface mobility.

21. The method of claim 20, wherein the second metal-organic chemical vapor deposition step is performed using a chemistry selected so that the resulting deposited metal species has a second surface mobility greater than the first surface mobility.

22. The method of claim 18, wherein the act of performing the first metal-organic chemical vapor deposition step comprises using a reducing chemistry.

23. The method of claim 22, wherein the act of performing the first metal-organic chemical vapor deposition step comprises introducing a metal-organic compound into a CVD chamber in the presence of a reactant selected from the group consisting of $H_2$, $NH_3$, and $H_2O$.

24. The method of claim 18, wherein the act of performing the second metal-organic chemical vapor deposition step comprises using an oxidizing chemistry.

25. The method of claim 24, wherein the act of performing the second metal-organic chemical vapor deposition step comprises introducing a metal-organic compound into a CVD chamber in the presence of a reactant selected form the group consisting of $N_2O$, $O_2$, NO and $O_3$.

26. The method of claim 18, wherein the acts (i) and (ii) comprise introducing a platinum and rhodium metal-organic mixture into a CVD chamber in the presence of one or more reactants.

* * * * *

UNITED STATES PATENT AND TRADEMARK OFFICE
CERTIFICATE OF CORRECTION

PATENT NO. : 6,918,960 B2
DATED : July 19, 2005
INVENTOR(S) : Li et al.

It is certified that error appears in the above-identified patent and that said Letters Patent is hereby corrected as shown below:

Column 1,
Line 23, delete "modem" and insert -- modern --.

Column 2,
Line 40, delete "reintroducing" and insert -- re-introducing --.

Column 8,
Line 14, after "film" delete ";" and insert -- . --.
Line 50, after "$N_2O$" delete "$_2$" and insert -- $O_2$ --.
Line 58, after "chamber" delete "," and insert -- ; --.

Column 10,
Line 34, after "selected" delete "form" and insert -- from --.

Signed and Sealed this

Seventh Day of February, 2006

JON W. DUDAS
*Director of the United States Patent and Trademark Office*